United States Patent
Costello et al.

(10) Patent No.: US 10,868,393 B2
(45) Date of Patent: Dec. 15, 2020

(54) ELECTRICAL CONNECTOR ASSEMBLY FOR A COMMUNICATION SYSTEM

(71) Applicant: TE CONNECTIVITY CORPORATION, Berwyn, PA (US)

(72) Inventors: Brian Patrick Costello, Scotts Valley, CA (US); Michael David Herring, Apex, NC (US); Arash Behziz, Newbury Park, CA (US); Howard Wallace Andrews, Jr., Hummelstown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/397,327

(22) Filed: Apr. 29, 2019

(65) Prior Publication Data

US 2019/0356089 A1 Nov. 21, 2019

Related U.S. Application Data

(60) Provisional application No. 62/672,642, filed on May 17, 2018.

(51) Int. Cl.
| | |
|---|---|
| *H01R 13/648* | (2006.01) |
| *H01R 13/6587* | (2011.01) |
| *H01R 12/72* | (2011.01) |
| *H01R 12/73* | (2011.01) |
| *H01R 13/6471* | (2011.01) |
| *H01R 13/66* | (2006.01) |
| *H01R 13/6583* | (2011.01) |
| *H01R 13/514* | (2006.01) |
| *H01R 43/24* | (2006.01) |

(52) U.S. Cl.
CPC ....... *H01R 13/6587* (2013.01); *H01R 12/724* (2013.01); *H01R 12/737* (2013.01); *H01R 13/514* (2013.01); *H01R 13/6471* (2013.01); *H01R 13/6583* (2013.01); *H01R 13/665* (2013.01); *H01R 43/24* (2013.01)

(58) Field of Classification Search
CPC .................................................. H01R 23/688
USPC ....... 439/108, 607.07, 607.09, 607.1, 607.39
See application file for complete search history.

(56) References Cited

U.S. PATENT DOCUMENTS

| | | | |
|---|---|---|---|
| 6,293,827 B1 * | 9/2001 | Stokoe ................. | H01R 12/724 439/607.07 |
| 6,517,360 B1 * | 2/2003 | Cohen ................ | H01R 13/6585 439/65 |

(Continued)

FOREIGN PATENT DOCUMENTS

WO 2016179263 A1 11/2016

*Primary Examiner* — Thanh Tam T Le

(57) ABSTRACT

An electrical connector assembly for a communication system includes a housing and a wafer assembly including a PCB terminated contact wafer and a cable terminated contact wafer arranged in a wafer stack. The PCB terminated contact wafer includes a first contact array having first signal contacts having mating portions and terminating ends for termination to a printed circuit board of the communication system. The cable terminated contact wafer includes a second contact array having second signal contacts and a second contact holder having a mating interface and holding terminating ends of the second signal contacts at the mating interface for electrically connection to a cable connector of a cable assembly.

20 Claims, 11 Drawing Sheets

(56) References Cited

U.S. PATENT DOCUMENTS

| | | | | |
|---|---|---|---|---|
| 7,371,117 B2* | 5/2008 | Gailus | ............... | H01R 13/719 |
| | | | | 439/607.08 |
| 7,871,296 B2* | 1/2011 | Fowler | ............... | H01R 12/724 |
| | | | | 439/108 |
| 7,967,637 B2* | 6/2011 | Fedder | ............... | H01R 13/6587 |
| | | | | 439/607.06 |
| 8,016,616 B2* | 9/2011 | Glover | ............... | H01R 12/585 |
| | | | | 439/607.05 |
| 8,083,553 B2* | 12/2011 | Manter | ............... | H01R 13/514 |
| | | | | 439/701 |
| 8,182,289 B2* | 5/2012 | Stokoe | ............... | H01R 12/721 |
| | | | | 439/607.11 |
| 8,298,015 B2* | 10/2012 | Cohen | ............... | H01R 13/648 |
| | | | | 439/607.1 |
| 8,419,472 B1* | 4/2013 | Swanger | ............... | H01R 13/6587 |
| | | | | 439/607.07 |
| 8,550,861 B2* | 10/2013 | Cohen | ............... | H01R 12/58 |
| | | | | 439/858 |
| 8,753,148 B2* | 6/2014 | Wozniak | ............... | H01R 12/585 |
| | | | | 439/607.05 |
| 8,845,364 B2* | 9/2014 | Wanha | ............... | H01R 13/516 |
| | | | | 439/607.07 |
| 8,864,521 B2* | 10/2014 | Atkinson | ............... | H01R 13/6471 |
| | | | | 439/607.07 |
| 9,011,177 B2 | 4/2015 | Lloyd et al. | | |
| 9,142,921 B2 | 9/2015 | Wanha et al. | | |
| 10,367,280 B2* | 7/2019 | Lloyd | ............... | H01R 13/6275 |

\* cited by examiner

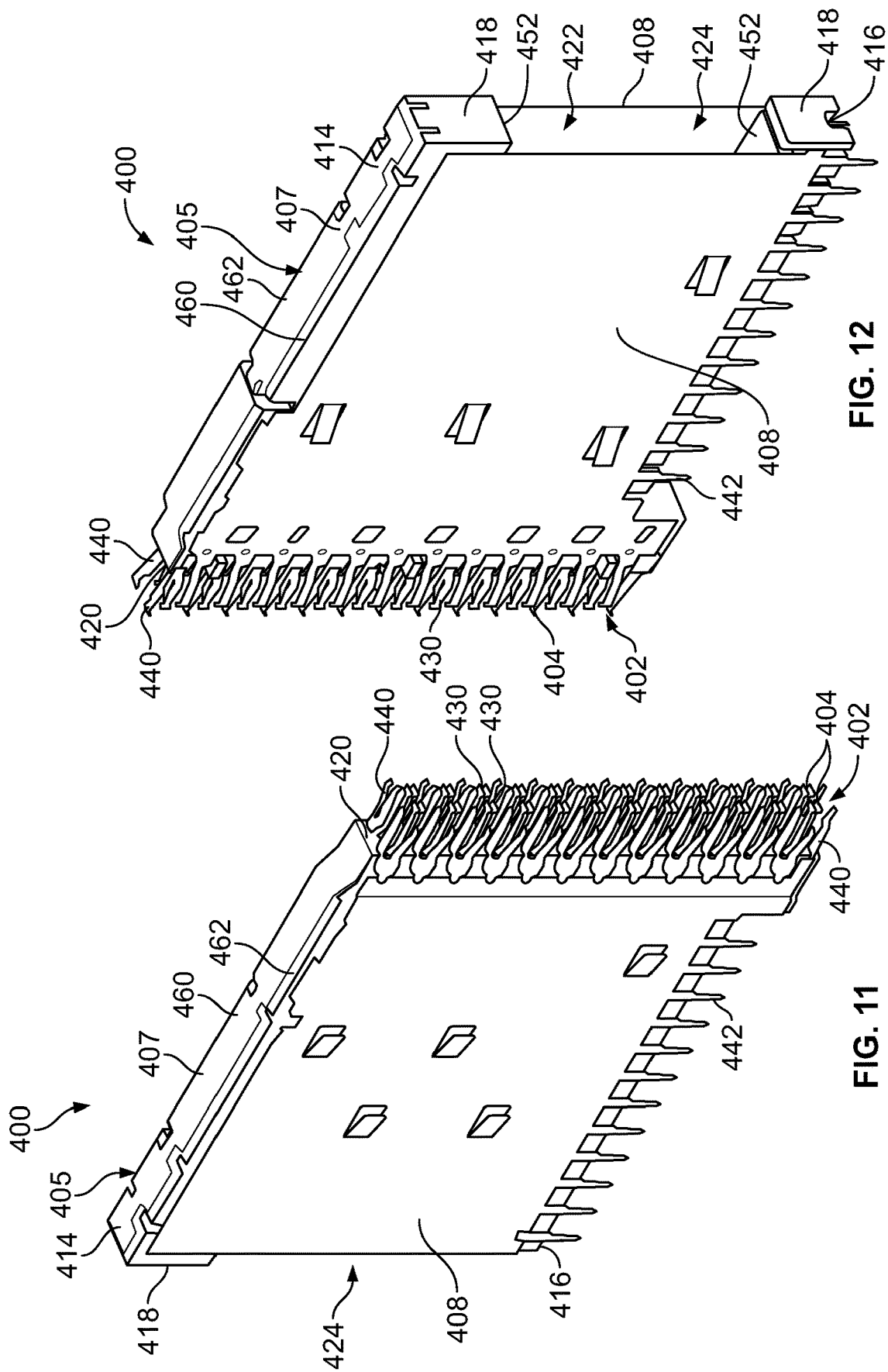

ELECTRICAL CONNECTOR ASSEMBLY FOR A COMMUNICATION SYSTEM

CROSS REFERENCE TO RELATED APPLICATIONS

This application claims benefit to U.S. Provisional Application No. 62/672,642, filed May 17, 2018, titled "ELECTRICAL CONNECTOR ASSEMBLY FOR A COMMUNICATION SYSTEM", the subject matter of which is herein incorporated by reference in its entirety.

BACKGROUND OF THE INVENTION

The subject matter herein relates generally to an electrical connector assembly for a communication system.

Communication systems, such as network systems, servers, data centers, and the like, use large printed circuit boards, such as backplanes, midplanes, daughtercards, line cards and/or switch cards. The communication systems generally use high speed differential pair connectors mounted to the printed circuit boards to transmit signals. The printed circuit boards interconnect the various connectors to each other or to other communication components using traces within the printed circuit board.

However, known communication systems using such large printed circuit boards are not without disadvantages. For instance, as the printed circuit boards are populated with more and more connectors and communication components, it is difficult to maintain signal integrity for signal channels through the printed circuit board that have long path lengths across the printed circuit board. However, signal paths that are relatively short, may not suffer from such signal integrity issues. Some known communication systems use cable connectors and cables, rather than board mounted connectors and signal traces on the printed circuit boards, to interconnect the connectors and the various components because cables have better signal carrying capability. However, cabled systems are expensive. Additionally, managing the many cables connecting each of the components is problematic. Other known communication systems use active signal re-generation devices within the system. However, such devices add latency to the signal, consume power and add cost.

A need remains for a communication system having cost effective and reliable interconnection of connectors and components within the communication system.

BRIEF DESCRIPTION OF THE INVENTION

In one embodiment, an electrical connector assembly for a communication system is provided including a housing having a mating end configured for mating with a mating electrical connector and a wafer assembly received in a chamber of the housing including a PCB terminated contact wafer and a cable terminated contact wafer arranged parallel to each other in a wafer stack. The PCB terminated contact wafer includes a first contact array having first signal contacts, a first contact holder holding the first signal contacts, and a first ground shield extending along the first contact holder to provide electrical shielding for first signal contacts. The first signal contacts has mating portions arranged in the housing for mating with the mating electrical connector and terminating ends extending from the first contact holder for termination to a printed circuit board of the communication system. The cable terminated contact wafer includes a second contact array having second signal contacts, a second contact holder holding the second signal contacts, and a second ground shield extending along the second contact holder to provide electrical shielding for second signal contacts. The second contact holder includes a mating interface configured to mate with a cable connector of a cable assembly. The second signal contacts have mating portions arranged in the housing for mating with the mating electrical connector and terminating ends arranged at the mating interface for electrical connection to the cable connector.

In another embodiment, a communication system is provided including a printed circuit board having a first mounting area, a second mounting area remote from the first mounting area and a third mounting area having a communication component electrically connected to the printed circuit board at the third mounting area. The printed circuit board has a first circuit between the first mounting area and the third mounting area being electrically connected to the communication component and a second circuit between the second mounting area and the third mounting area being electrically connected to the communication component. The communication system includes a remote connector electrically connected to the printed circuit board at the second mounting area. The communication system includes a cable assembly having a bundle of cables extending between a first cable connector and a second cable connector mated with and electrically connected to the remote connector. The communication system includes an electrical connector assembly electrically connected to the printed circuit board at the first mounting area. The electrical connector assembly includes a housing having a mating end configured for mating with a mating electrical connector and a wafer assembly received in a chamber of the housing. The wafer assembly includes a PCB terminated contact wafer and a cable terminated contact wafer arranged parallel to each other in a wafer stack. The PCB terminated contact wafer includes a first contact array having first signal contacts, a first contact holder holding the first signal contacts, and a first ground shield extending along the first contact holder to provide electrical shielding for first signal contacts. The first signal contacts have mating portions arranged in the housing for mating with the mating electrical connector and terminating ends extending from the first contact holder for termination to a printed circuit board of the communication system. The terminating ends of the first signal contacts are electrically connected to the first circuit of the printed circuit board at the first mounting area. The cable terminated contact wafer includes a second contact array having second signal contacts, a second contact holder holding the second signal contacts, and a second ground shield extending along the second contact holder to provide electrical shielding for second signal contacts. The second contact holder includes a mating interface configured to mate with the first cable connector of the cable assembly. The second signal contacts have mating portions arranged in the housing for mating with the mating electrical connector and terminating ends arranged at the mating interface for electrical connection to the second cable connector. The second signal contacts are electrically connected to the second circuit of the printed circuit board through the cables and the remote connector.

In a further embodiment, a communication system is provided including a printed circuit board having a first mounting area, a second mounting area remote from the first mounting area and a third mounting area having a communication component electrically connected to the printed circuit board at the third mounting area. The printed circuit board has a first circuit between the first mounting area and the third mounting area being electrically connected to the communication component. The communication system includes a first electrical connector assembly electrically connected to the printed circuit board at the first mounting area. The first electrical connector assembly includes a first housing having a mating end configured for mating with a first mating electrical connector and a first wafer assembly received in a chamber of the first housing. The first wafer assembly includes a plurality of PCB terminated contact wafers arranged parallel to each other in a first wafer stack. Each PCB terminated contact wafer includes a first contact array of first signal contacts held by a first contact holder having mating portions arranged in the first housing defining a first mating interface for mating with the first mating electrical connector and first terminating ends extending from the first contact holder for termination to the first circuit of the printed circuit board at the first mounting area. The communication system includes a second electrical connector assembly electrically connected to the printed circuit board at the second mounting area. The second electrical connector assembly includes a second housing having a mating end configured for mating with a second mating electrical connector and a second wafer assembly received in a chamber of the second housing. The second wafer assembly includes a plurality of cable terminated contact wafers arranged parallel to each other in a second wafer stack. Each cable terminated contact wafer includes a second contact array of second signal contacts held by a second contact holder having second mating portions arranged in the second housing defining a second mating interface for mating with the second mating electrical connector and second terminating ends. The second contact holder includes a mating interface configured to mate with a cable connector of a cable assembly. The second terminating ends are arranged at the mating interface for electrical connection to the cable connector. The first mating interface and the second mating interface are each configured to mate with either of the first and second mating electrical connectors. The first electrical connector assembly is electrically connected to the communication component through the first circuit of the printed circuit board. The second electrical connector assembly is electrically connected to the communication component through cables of the cable assembly.

BRIEF DESCRIPTION OF THE DRAWINGS

FIG. 11 is a front perspective view of a cable terminated contact wafer of the electrical connector assembly shown in FIG. 8 in accordance with an exemplary embodiment.

FIG. 12 is a rear perspective view of the cable terminated contact wafer in accordance with an exemplary embodiment.

DETAILED DESCRIPTION OF THE INVENTION

Figure 1:
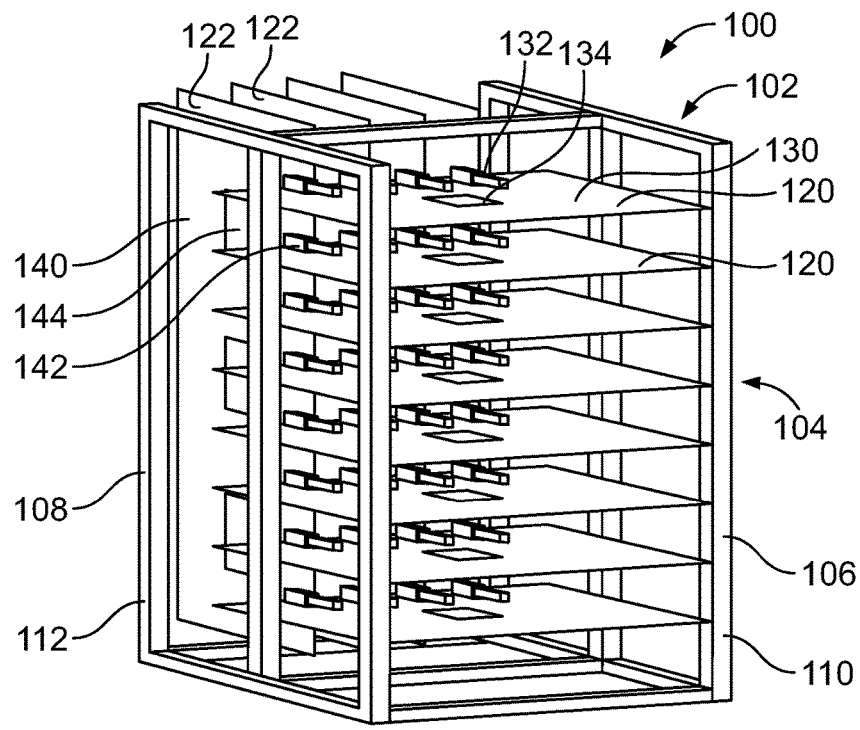
FIG. 1 illustrates a communication system in accordance with an exemplary embodiment.

FIG. 1 illustrates a communication system 100 formed in accordance with an exemplary embodiment. The communication system 100 includes a chassis 102 having a frame 104 configured to hold communication components, such as network equipment components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may be utilized in a data communication application, such as part of a data center switch or server having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112.

Figure 2:
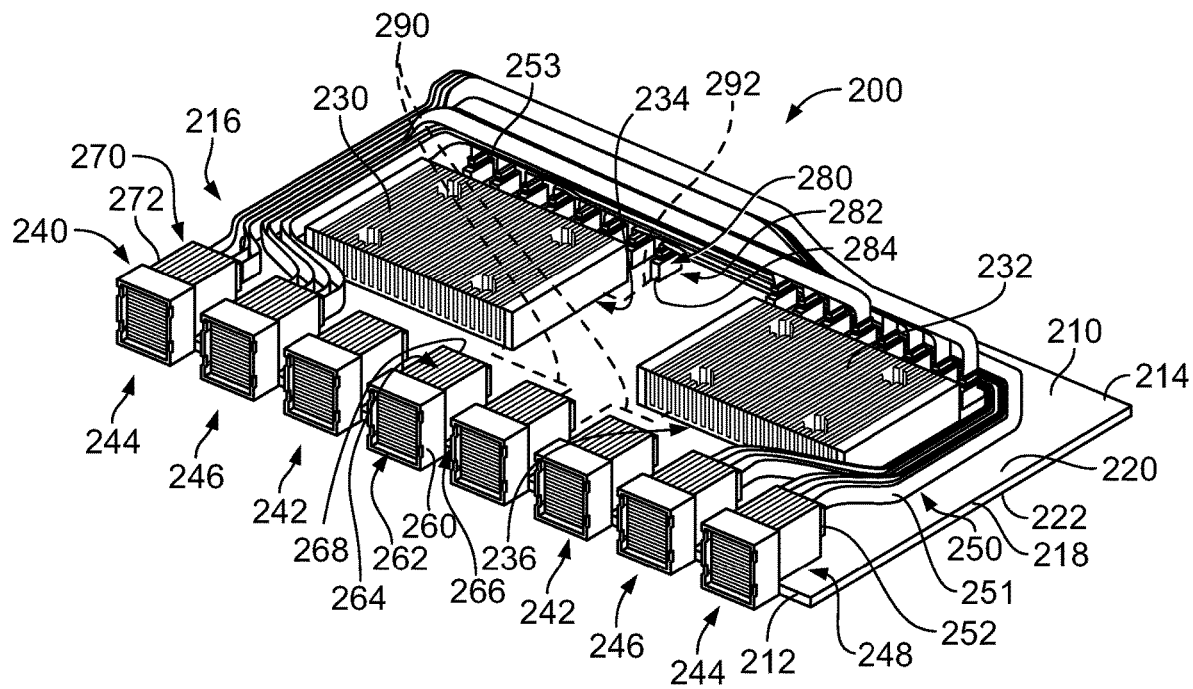
FIG. 2 is a front perspective view of a circuit card assembly of the communication system in accordance with an exemplary embodiment.

The first circuit card assembly 120 includes a first printed circuit board (PCB) 130 and a first electrical connector assembly 132 mounted to the first PCB 130. The first PCB 130 may include any number of the electrical connector assemblies 132, such as one electrical connector assembly 132 for electrically connecting to each corresponding second circuit card assembly 122. The first PCB 130 may include one or more communication components 134 (such as shown in FIG. 2) thereon. For example, the communication components 134 may be electrical components, optical components, or other types of components. In an exemplary embodiment, one or more of the communication components 134 may be on-board optical modules. The communication components 134 may include optical/digital converters for converting between optical and electrical signals. Other types of communication components 134 may be provided on the first PCB 130, such as processors, memory modules, signal processing devices, antennas, input/output connectors, or other types of components.

The second circuit card assembly 122 includes a second PCB 140 and a second electrical connector assembly 142 mounted to the second PCB 140. The second PCB 140 may include any number of the electrical connector assemblies 142, such as one electrical connector assembly 142 for electrically connecting to each corresponding first circuit card assembly 120. The second PCB 140 may include one or more communication components 144 thereon. For example, the communication components 144 may be electrical components, optical components, or other types of components. In an exemplary embodiment, one or more of the communication components 144 may be on-board optical modules. The communication components 144 may include optical/digital converters for converting between optical and electrical signals. Other types of communication components 144 may be provided on the second PCB 140, such as processors, memory modules, signal processing devices, antennas, input/output connectors, or other types of components.

Figure 3:
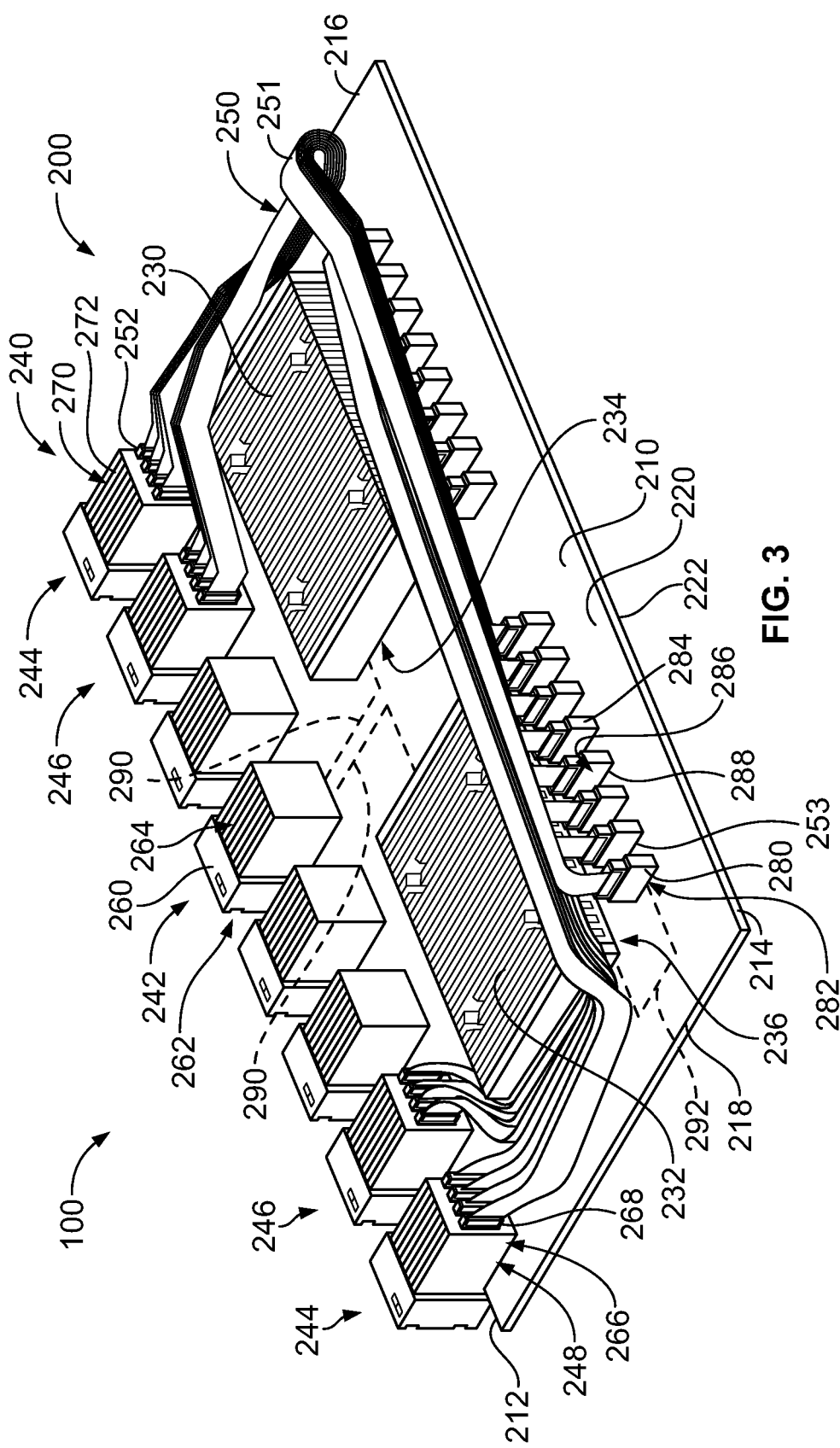
FIG. 3 is a rear perspective view of the circuit card assembly in accordance with an exemplary embodiment.
Figure 4:
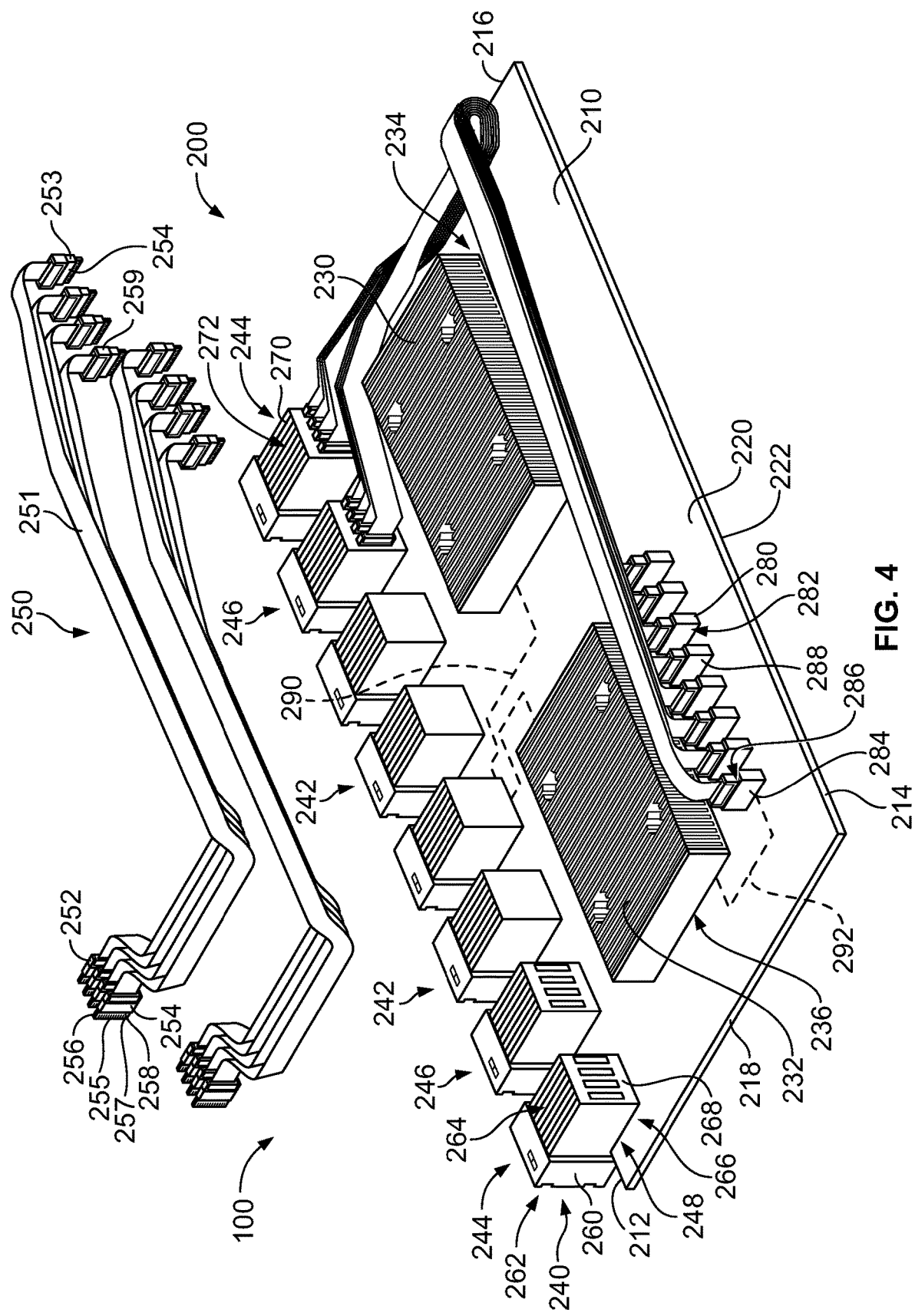
FIG. 4 is a partially exploded view of the circuit card assembly in accordance with an exemplary embodiment.

FIG. 2 is a front perspective view of a circuit card assembly 200 in accordance with an exemplary embodiment. FIG. 3 is a rear perspective view of the circuit card assembly 200 in accordance with an exemplary embodiment. FIG. 4 is a partially exploded view of the circuit card assembly 200 in accordance with an exemplary embodiment. The circuit card assembly 200 may be used with the communication system 100, such as the first circuit card assembly 120 and/or the second circuit card assembly 122 shown in FIG. 1.

The circuit card assembly 200 includes a printed circuit board (PCB) 210. The PCB 210 may be a daughter card circuit board, or another type of circuit card in various embodiments. The PCB includes a front 212, a rear 214, a first end 216, and a second end 218. The PCB 210 includes a first surface 220 and a second surface 222. The PCB 210 may include any number of layers between the first and second surfaces 220, 222. The PCB 210 hosts components on the first surface 220 and/or the second surface 222. In various embodiments, the PCB 210 may be oriented horizontally such that the first surface 220 is a top surface. In other various embodiments, the PCB 210 may be oriented vertically such that the first surface 220 is a side surface. The PCB 210 has various circuits interconnecting corresponding components of the circuit card assembly 200. The circuits may be defined by pads, vias, traces, or other conductors of the PCB 210.

The circuit card assembly 200 includes one or more communication components on the PCB 210. In the illustrated embodiment, the circuit card assembly 200 includes a first end communication component 230 and a second end communication component 232. The first end communication component 230 is near the first end 216. The second end communication component 232 is near the second end 218. The circuit card assembly 200 may include other communication components, such as a central communication component between the communication components 230, 232. The communication components 230, 232 are coupled to the PCB 210 at corresponding mounting areas 234, 236. The communication components 230, 232 are electrically connected to the PCB 210 at the corresponding mounting area 234, 236. For example, the communication components 230, 232 may be soldered, press-fit, compression mated through a land grid array, electrically connected by a connector or interposer assembly, or otherwise electrically connected to the PCB 210.

The communication components 230, 232 may be electrical components, optical components, or other types of components. In an exemplary embodiment, the communication components 230, 232 may be on-board optical modules. The communication components 230, 232 may include optical/digital converters for converting between optical and electrical signals. Other types of communication components 230, 232 may be provided on the PCB 210, such as ASICs (Application Specific Integrated Circuits), processors, memory modules, signal processing devices, antennas, or other types of components.

The circuit card assembly 200 includes a plurality of electrical connector assemblies 240. In the illustrated embodiment, the electrical connector assemblies 240 are mounted to the PCB 210 along the front 212. The electrical connector assemblies 240 have mating ends that face forward for mating with a mating circuit card assembly, backplane assembly, midplane assembly, or cable assembly. In an exemplary embodiment, the electrical connector assemblies 240 are high-speed differential pair electrical connectors. The electrical connector assemblies 240 may be electrically connected to each other and/or to the communication components 230, 232. In various embodiments, each electrical connector assembly 240 is electrically connected to both communication components 230, 232.

In an exemplary embodiment, the circuit card assembly 200 includes different types of electrical connector assemblies 240. For example, the circuit card assembly 200 may include board electrical connector assemblies 242 and may include cable electrical connector assemblies 244. The board electrical connector assemblies 242 are directly terminated to the PCB 210 such that the signal paths flow directly to the PCB 210 from the board electrical connector assembly 242. The cable electrical connector assemblies 244 are electrically connected to the PCB 210 through a cable assembly 250. For example, the cable assemblies 250 are routed to a remote location for termination to the PCB 210. In an exemplary embodiment, the circuit card assembly 200 may include hybrid electrical connector assemblies 246. The hybrid electrical connector assemblies 246 are a hybrid between the board electrical connector assemblies 242 and the cable electrical connector assemblies 244. The hybrid electrical connector assemblies 246 have two different kinds of signal paths to the PCB 210. The hybrid electrical connector assemblies 246 are electrically connected to the PCB 210 by a direct electrical connection from the hybrid electrical connector assembly 246 and are electrically connected to the PCB 210 by corresponding cable assemblies 250. Some signal paths flow directly from the hybrid electrical connector assembly 246 into the PCB 210 while other signal paths flow to the PCB 210 through the corresponding cable assemblies 250.

In an exemplary embodiment, the type of electrical connector assembly may depend on the signal path lengths between the electrical connector assemblies 240 and the source or destination for the signals. For short signal path lengths, such signals may be routed through a direct connection to the PCB 210 from the electrical connector assembly 240. For long signal path lengths, such signals may be routed through the cable assembly 250. As such, the type of electrical connector assembly (for example, board electrical connector assembly 242, cable electrical connector assembly 244, hybrid electrical connector assembly 246) may depend on the position of the electrical connector assembly 240 along the front 212. In an exemplary embodiment, each electrical connector assembly 240 is mounted to the PCB 210 at a corresponding mounting area 248. The distance between the mounting area 248 and the mounting areas 234, 236 may determine the type of electrical connector assembly mounted in the particular mounting area 248. For example, if the mounting area 248 is relatively close to both mounting areas 234, 236, one of the board electrical connector assemblies 242 may be mounted in such mounting area 248 because the signal path lengths between such mounting area 248 and both mounting areas 234, 236 may be relatively short. However, the location of some mounting areas 248 may be close to one mounting area 234 or 236 and far from the other mounting area 236 or 234. One of the hybrid electrical connector assemblies 246 may be mounted in such mounting area 248 such that the signal paths associated with the close mounting area may have direct connection to the PCB 210 while the signal paths associated with the far mounting area may be connected via the cable assembly 250. The location of some mounting areas 248 may be far from both mounting areas 234, 236. One of the cable electrical connector assemblies 244 may be mounted in such mounting area 248 such that all of the signal paths may be routed through the cable assemblies 250. When designing the circuit card assembly 200, the designer may determine a threshold signal path length corresponding to a threshold signal degradation. Signal paths longer than the threshold signal path length may be connected by cable assemblies 250, whereas signal paths shorter than the threshold signal path length may be connected by direct connection to the PCB 210.

Each electrical connector assembly 240 includes a front housing 260 at a mating end 262 of the electrical connector assembly 240 and a wafer assembly 270 at a mounting end 266 of the electrical connector assembly 240. In an exemplary embodiment, the electrical connector assembly 240 defines a header connector, wherein the front housing 260 forms a receptacle for receiving the mating connector assembly (not shown). Alternatively, the electrical connector assembly 240 may define a receptacle connector assembly or another type of connector assembly. The mounting end 266 is mounted to the PCB 210. For example, the mounting end 266 may be mounted to the first surface 220 at or near the front 212 and the corresponding mounting area 248. In the illustrated embodiment, the front housing 260 hangs over the edge at the front 212 of the PCB 210. The wafer assembly 270 includes a plurality of wafers 272 arranged in a stacked configuration as a wafer stack 264. The wafers 272 are stacked parallel to each other. In an exemplary embodiment, the wafers 272 are oriented perpendicular to the first surface 220 of the PCB 210. The wafers 272 may be mounted to the PCB 210, such as using press-fit pins or other mounting features. In an exemplary embodiment, as described in further detail below, the cable assemblies 250 are connected to the corresponding electrical connector assemblies 240 at a rear 268 of the electrical connector assembly 240. The rear 268 may be opposite the mating ends 262.

Figure 5:
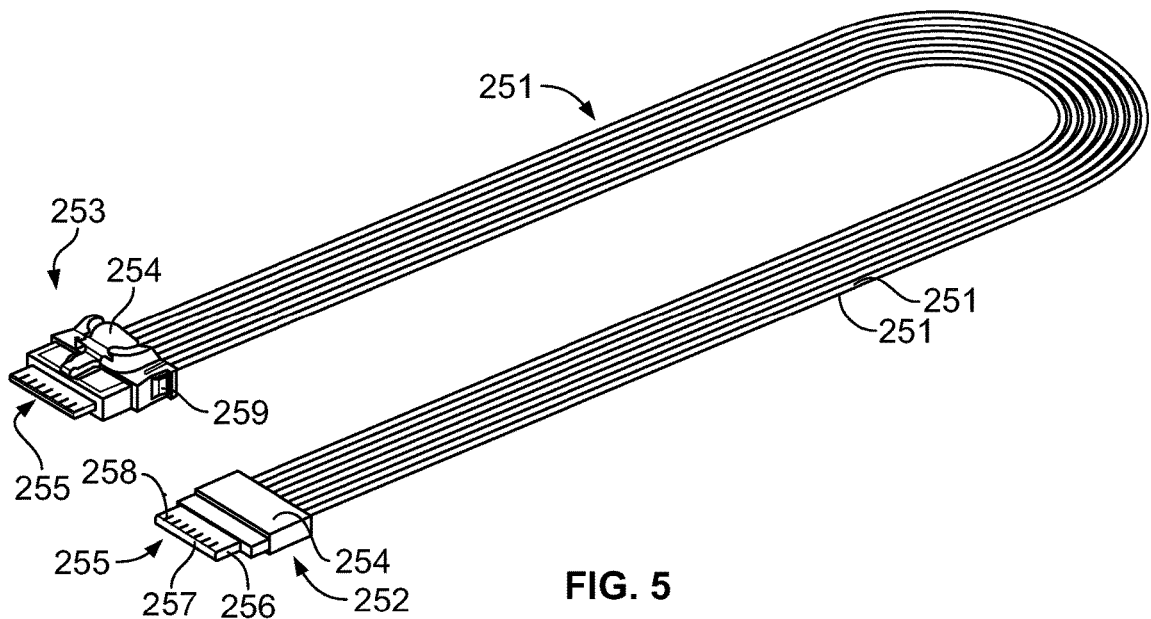
FIG. 5 illustrates an exemplary embodiment of a cable assembly of the communication system.

With additional reference to FIG. 5, which illustrates an exemplary embodiment of the cable assembly 250, the cable assembly 250 includes a bundle of cables 251 extending between a first cable connector 252 and a second cable connector 253. In an exemplary embodiment, each cable connector 252, 253 includes a housing 254 and a plug connector 255 at a mating end thereof. However, the cable connectors 252, 253 may have other interfaces other than plug connectors for interfacing with the wafers 272, such as socket connectors or other mating interfaces. In the illustrated embodiment, the plug connector 255 includes a circuit card 256 having a card edge 257 for mating with the electrical connector assembly 240 or another connector. The plug connector 255 includes plug contacts 258 at the card edge 257. Optionally, the plug contacts 258 may be provided on both sides of the card edge 257. The cables 251 may be terminated to the circuit card 256. For example, the conductors of the cables 251 may be soldered, crimped, or otherwise electrically connected to the circuit card 256 and/or the plug contacts 258. Optionally, the plug contacts 258 may be arranged in pairs carrying differential signals. The plug contacts 258 may include signal contacts and ground contacts. The ground contacts may be arranged between corresponding signal contacts, such as between pairs of signal contacts. Optionally, one or both of the cable connectors 252, 253 may include a latch 259 for latch of the securing the cable connector 252 or 253 with the electrical connector assembly 240 or of the other connector.

Returning to FIGS. 2-4, the circuit card assembly 200 includes a plurality of remote connectors 280 remote from the electrical connector assemblies 240. The remote connectors 280 are electrically connected to the PCB 210. For example, the remote connectors 280 may be mounted to the PCB 210 at corresponding mounting areas 282. Optionally, the mounting areas 282 may be located adjacent the mounting areas 234, 236. In an exemplary embodiment, the cable assemblies 250 are mated with the remote connectors 280. For example, the cable connectors 253 are electrically connected to corresponding remote connectors 280. In an exemplary embodiment, the remote connectors 280 are socket connectors. Each remote connector 280 includes a housing 284 having a socket 286 for receiving the plug connector 255 of the cable connector 253. Each remote connector 280 includes contacts 288 terminated to the PCB 210.

The PCB 210 includes circuits 290 between the mounting areas 248 and the mounting areas 234, 236. The PCB 210 includes circuits 292 between the mounting areas 282 and the mounting areas 234, 236. The circuits 290 electrically connect the electrical connector assemblies 240 and the communication components 230, 232. The circuits 292 electrically connect the remote connectors 280 and the communication components 230, 232. First signal paths are defined between certain electrical connector assemblies 240 and the communication components 230, 232 along the circuits 290 through the PCB 210. The electrical connector assemblies 240 are electrically connected to the PCB 210 at the mounting areas 248 such that the first signal paths flow from the electrical connector assemblies 240 into the PCB 210 and then into the communication components 230, 232. Second signal paths are defined between certain electrical connector assemblies 240 and the communication components 230, 232 along the cables 251 and the circuits 292 through the PCB 210. The electrical connector assemblies 240 are electrically connected to the remote connectors 280 by the cable assemblies 250. The remote connectors 280 are electrically connected to the communication components 230, 232 by the circuits 290 through the PCB 210.

In various embodiments, the electrical connector assemblies 240 near the second end 218 are electrically connected to the first communication component 230 near the first end 216 through the cable assemblies 250 because the signal path lengths would be long if routed through the PCB 210. For example, each of the remote connectors 280 adjacent the first communication component 230 are electrically connected to cable assemblies 250 routed to the electrical connector assemblies 240 near the second end 218 of the PCB 210. Similarly, the electrical connector assemblies 240 near the first end 216 are electrically connected to the second communication component 232 near the second end 218 through the cable assemblies 250 because the signal path lengths would be long if routed through the PCB 210. For example, each of the remote connectors 280 adjacent the second communication component 232 are electrically connected to cable assemblies 250 routed to the electrical connector assemblies 240 near the first end 216 of the PCB 210.

In various embodiments, the electrical connector assemblies 240 near the first end 216 are electrically connected to the first communication component 230 near the first end 216 through the direct connection with the PCB 210 and the corresponding circuits 290. Similarly, the electrical connector assemblies 240 near the second end 218 are electrically connected to the second communication component 232 near the second end 218 through the direct connection with the PCB 210 and the corresponding circuits 290. In various embodiments, the electrical connector assemblies 240 near the center of the PCB 210 are electrically connected to the first and second communication components 230, 232 through the direct connection with the PCB 210 and the corresponding circuits 290 because the signal path lengths are relatively short when routed through the PCB 210. Using cable assemblies for the electrical connector assemblies 240 close to the communication components 230, 232 would add unnecessary expense and additional cables that would need to be managed, and thus are eliminated, rather opting for the signal path routing through the PCB 210.

Figures 6, 7:
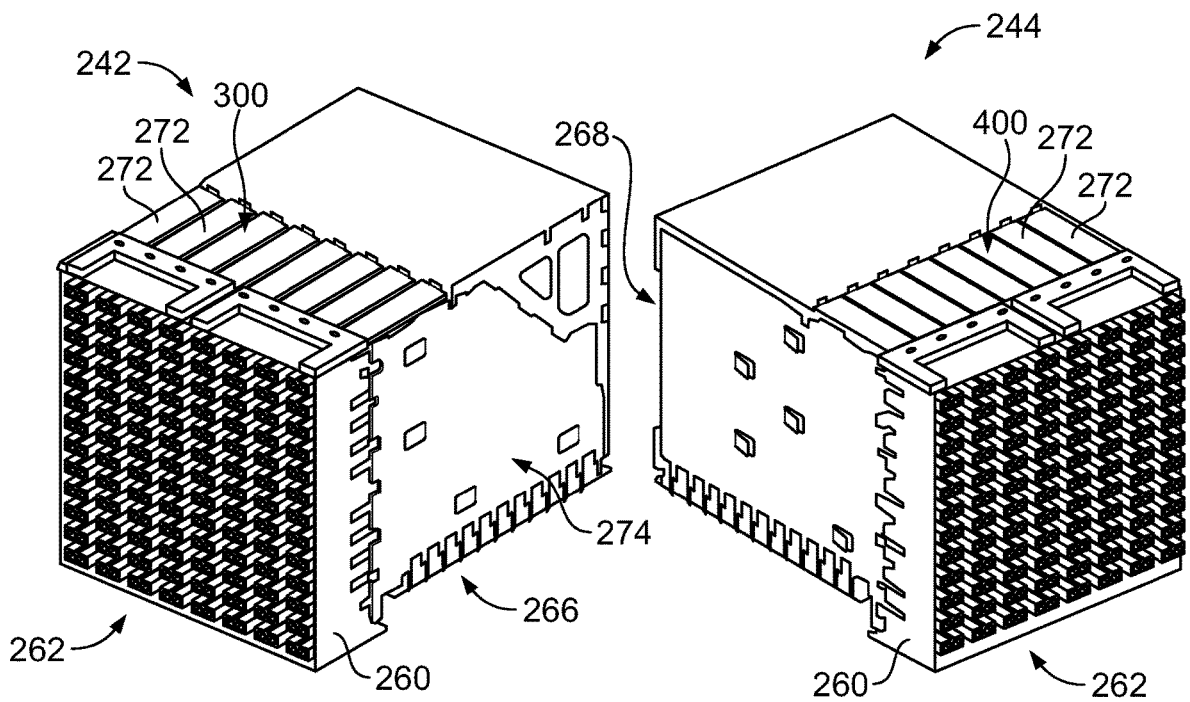
FIG. 6 is a front perspective view of an electrical connector assembly in accordance with an exemplary embodiment.
FIG. 7 is a front perspective view of an electrical connector assembly in accordance with an exemplary embodiment.

FIG. 6 is a front perspective view of the board electrical connector assembly 242 in accordance with an exemplary embodiment. In an exemplary embodiment, the wafers 272 in the board electrical connector assembly 242 are PCB terminated contact wafers 300, which may also be referred to hereinafter as simply PCB wafers 300. The board electrical connector assembly 242 does not include any cable terminated contact wafers 400 (shown in FIG. 7). The board electrical connector assembly 242 includes the front housing 260 that holds the PCB wafers 300 in a stacked configuration generally parallel to one another. The PCB wafers 300 may be loaded into the front housing 260 side-by-side in the stacked configuration as a unit or group. Any number of PCB wafers 300 may be provided in a particular board electrical connector assembly 242.

The PCB wafers 300 each include a plurality of signal contacts (shown in FIG. 9) that define signal paths through the board electrical connector assembly 242 configured to be terminated directly to the PCB 210 (shown in FIG. 2). The signal contacts are configured to be electrically connected to corresponding mating signal contacts of a mating electrical connector assembly. The signal contacts extend through the board electrical connector assembly 242 from the mating end 262 to the mounting end 266 for mounting to the PCB 210.

The signal contacts are received in the front housing 260 and held therein at the mating end 262 for electrical termination to the mating electrical connector assembly. The signal contacts are arranged in a matrix of rows and columns. Any number of signal contacts may be provided in the rows and columns. Optionally, the signal contacts may be arranged in pairs carrying differential signals; however other signal arrangements are possible in alternative embodiments, such as single-ended applications. Optionally, the pairs of signal contacts may be arranged in rows (pair-in-row signal contacts); however, the pairs of signal contacts may be arranged in columns (pair-in-column signal contacts) in alternative embodiments. In an exemplary embodiment, the signal contacts within each pair are contained within the same PCB wafer 300.

In an exemplary embodiment, each PCB wafer 300 has a shield structure 274 for providing electrical shielding for the signal contacts. The shield structure 274 is configured to be electrically connected to the mating electrical connector assembly and the PCB 210 by features, such as grounding pins and/or surface tabs. The shield structure 274 may provide shielding from electromagnetic interference (EMI) and/or radio frequency interference (RFI), and may provide shielding from other types of interference as well to better control electrical characteristics, such as impedance, crosstalk, and the like, of the signal contacts. The PCB wafers 300 provide shielding for each pair of signal contacts between the mating end 262 and the mounting end 266.

FIG. 7 is a front perspective view of the cable electrical connector assembly 244 in accordance with an exemplary embodiment. In an exemplary embodiment, the wafers 272 in the cable electrical connector assembly 244 are cable terminated contact wafers 400, which may also be referred to hereinafter as cable wafers 400. The cable electrical connector assembly 244 does not include any PCB wafers 300 (shown in FIG. 6). Rather, the electrical signals of the cable wafers 400 are routed through cables rather than through the PCB. The cable electrical connector assembly 244 includes the front housing 260 that holds the cable wafers 400 in a stacked configuration generally parallel to one another. The cable wafers 400 may be loaded into the front housing 260 side-by-side in the stacked configuration as a unit or group. Any number of cable wafers 400 may be provided in the cable electrical connector assembly 244.

The cable wafers 400 each include a plurality of signal contacts (shown in FIG. 9) that define signal paths through the cable electrical connector assembly 244 configured to be mated with the plug connector 255 (shown in FIG. 5) of the cable assembly 250 (shown in FIG. 5). The signal contacts are configured to be electrically connected to corresponding mating signal contacts of a mating electrical connector assembly. The signal contacts extend through the cable electrical connector assembly 244 from the mating end 262 to the rear 268 for mating with the plug connector 255.

The signal contacts are received in the front housing 260 and held therein at the mating end 262 for electrical termination to the mating electrical connector assembly. The signal contacts are arranged in a matrix of rows and columns. Any number of signal contacts may be provided in the rows and columns. Optionally, the signal contacts may be arranged in pairs carrying differential signals; however other signal arrangements are possible in alternative embodiments, such as single-ended applications. Optionally, the pairs of signal contacts may be arranged in rows (pair-in-row signal contacts); however, the pairs of signal contacts may be arranged in columns (pair-in-column signal contacts) in alternative embodiments. In an exemplary embodiment, the signal contacts within each pair are contained within the same cable wafer 400.

In an exemplary embodiment, the mating interface defined by the front housing 260 and the signal contacts of the cable electrical connector assembly 244 is similar to the mating interface defined by the front housing 260 and the signal contacts of the board electrical connector assembly 242 such that either electrical connector assembly 242, 244 may be mated with the same mating electrical connector assembly. The mating interfaces of the electrical connector assemblies 242, 244 may be identical. For example, the arrangement of the signal contacts in the rows and columns may be identical. As such, the electrical connector assemblies 242, 244 may be interchangeable within the circuit card assembly 200 on different PCBs 210.

In an exemplary embodiment, each cable wafer 400 has a shield structure 276 for providing electrical shielding for the signal contacts. The shield structure 276 is configured to be electrically connected to the mating electrical connector assembly and the PCB 210 by features, such as grounding pins and/or surface tabs. The shield structure 276 may provide shielding from electromagnetic interference (EMI) and/or radio frequency interference (RFI), and may provide shielding from other types of interference as well to better control electrical characteristics, such as impedance, crosstalk, and the like, of the signal contacts. The cable wafers 400 provide shielding for each pair of signal contacts between the mating end 262 and the rear 268.

Figure 8:
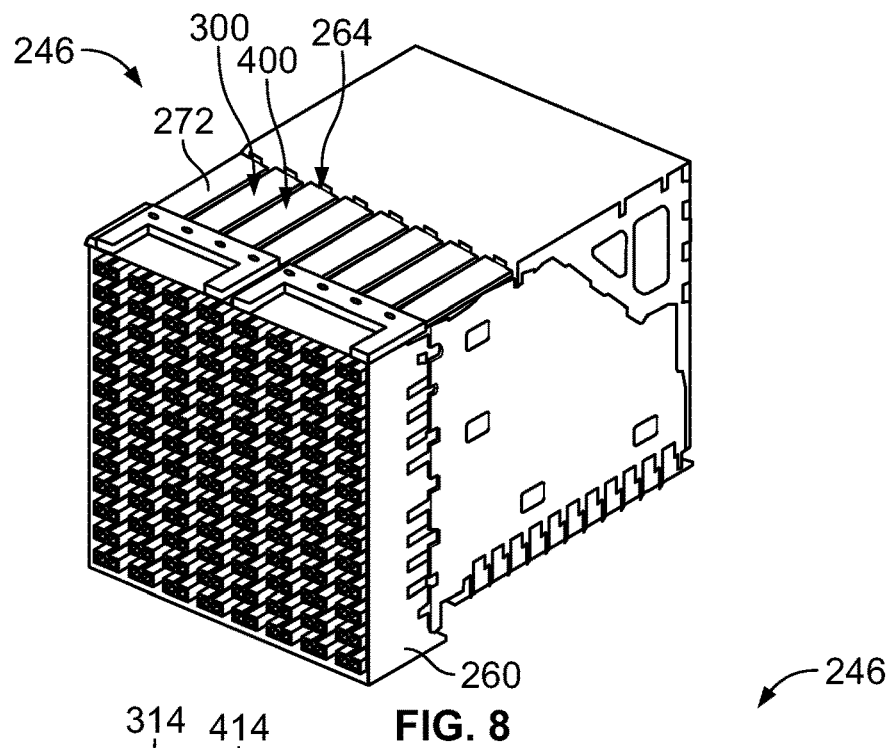
FIG. 8 is a front perspective view of an electrical connector assembly in accordance with an exemplary embodiment.
Figure 9:
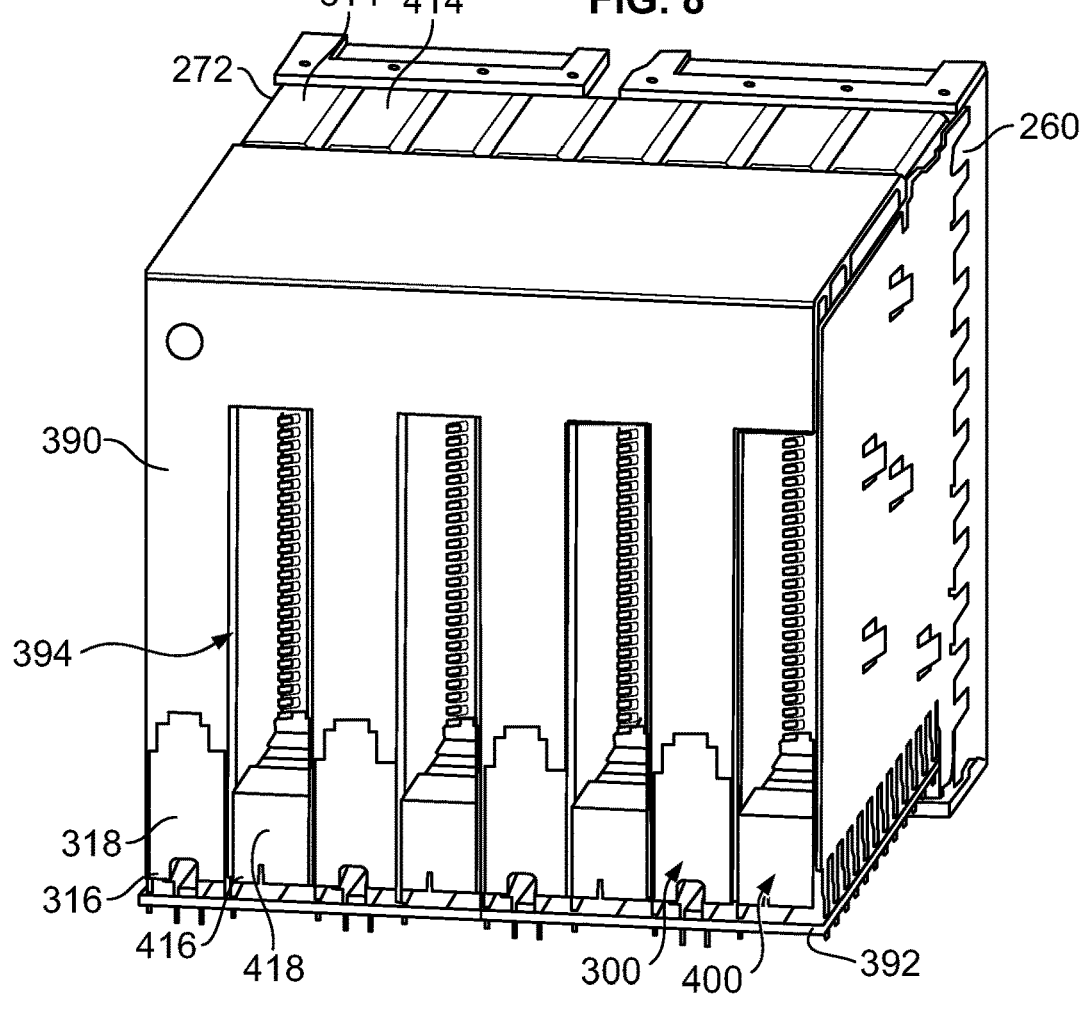
FIG. 9 is a rear perspective view of the electrical connector assembly shown in FIG. 8 in accordance with an exemplary embodiment.
Figure 10:
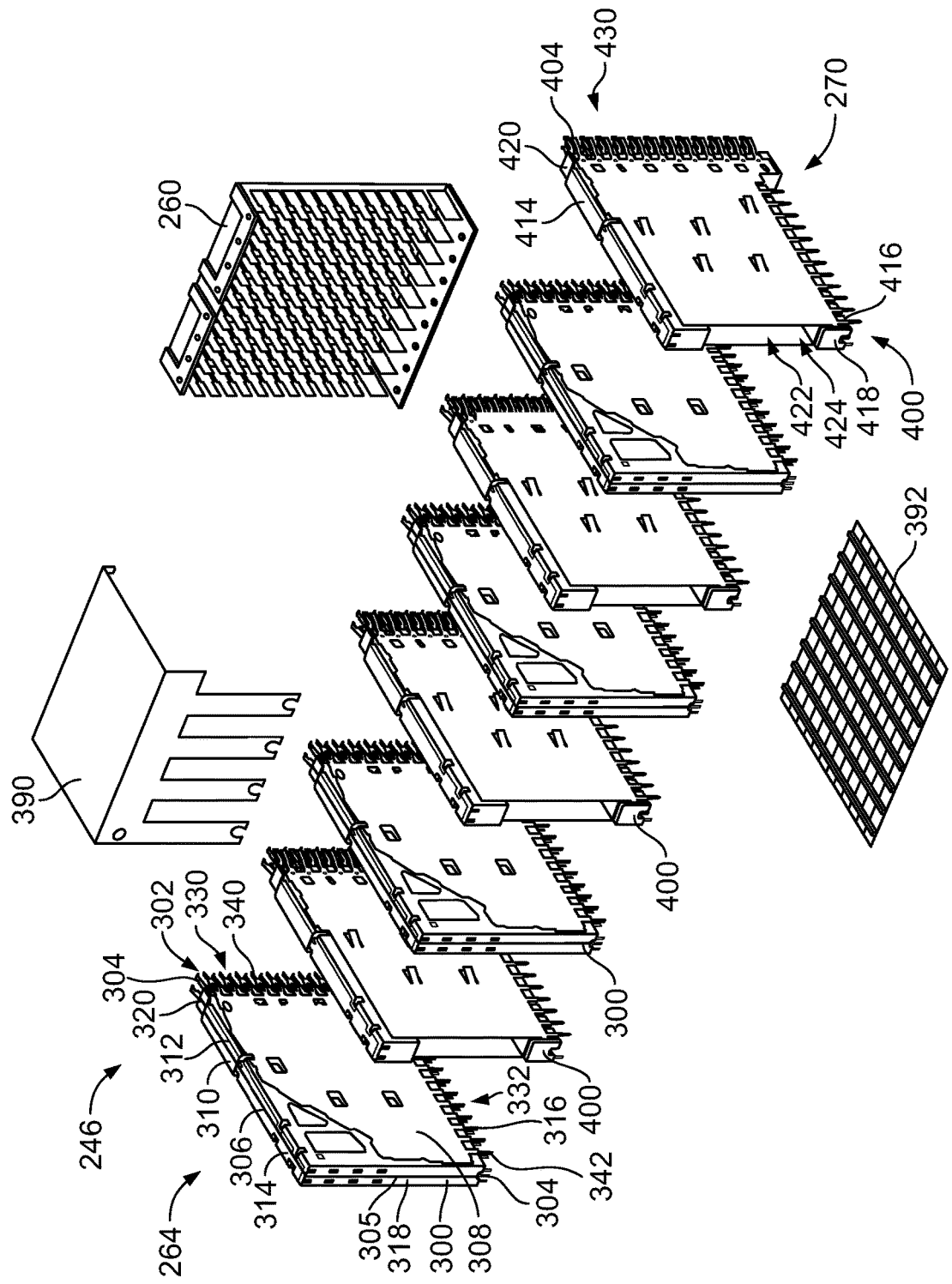
FIG. 10 is an exploded view of the electrical connector assembly shown in FIG. 8 in accordance with an exemplary embodiment.

FIG. 8 is a front perspective view of the hybrid electrical connector assembly 246 in accordance with an exemplary embodiment. FIG. 9 is a rear perspective view of the hybrid electrical connector assembly 246 in accordance with an exemplary embodiment. FIG. 10 is an exploded view of the hybrid electrical connector assembly 246 in accordance with an exemplary embodiment.

In an exemplary embodiment, the wafer assembly 270 in the hybrid electrical connector assembly 246 includes both PCB wafers 300 and cable wafers 400. The PCB wafers 300 and the cable wafers 400 may be arranged in any order. In the illustrated embodiment, the PCB wafers 300 and the cable wafers 400 are in an alternating sequence with PCB wafers 300 between cable wafers 400 and with cable wafers 400 between PCB wafers 300. Other arrangements are possible in alternative embodiments. The hybrid electrical connector assembly 246 includes the front housing 260 that holds the wafer assembly 270 with the PCB wafers 300 and the cable wafers 400 stacked generally parallel to one another. The wafer assembly 270 may be loaded into the front housing 260 as a unit or group. Any number of cable wafers 400 and any number of PCB wafers 300 may be provided in the hybrid electrical connector assembly 246.

The PCB wafer 300 includes a contact array 302 having signal contacts 304 (FIG. 10). A contact holder 305 holds the signal contacts 304. In an exemplary embodiment, the contact holder 305 includes a dielectric body 306 supporting the signal contacts 304. The contact holder 305 may include other components, such as a conductive shell holding the dielectric body 306 to provide electrical shielding for the signal contacts 304. In the illustrated embodiment, the PCB wafer 300 includes one or more ground shields 308 coupled to the dielectric body 306 to provide electrical shielding for the signal contacts 304.

In an exemplary embodiment, the dielectric body 306 includes a first holder member 310 and a second holder member 312 each holding a set of the signal contacts 304. The first and second holder members 310, 312 are arranged back-to-back to form the dielectric body 306. In the illustrated embodiment, the dielectric body 306 forms the outer perimeter of the contact holder 305. The contact holder 305 includes a top 314 and a bottom 316 defined by the dielectric body 306. The contact holder 305 includes a rear 318 and a front 320 defined by the dielectric body 306. In the illustrated embodiment, the contact holder 305 is generally rectangular shaped; however, the contact holder 305 may have other shapes in alternative embodiments. The contact holder 305 may include other components defining part of, or the entire outer perimeter of the contact holder 305 to define the top 314, the bottom 316, the rear 318 and/or the front 320. For example, the contact holder 305 may include a ground shell receiving and surrounding the dielectric body 306 that provide electrical shielding for the signal contacts 304, such as a plated plastic shell or a die cast shell.

The signal contacts 304 have mating portions 330 extending forward from the front 320 of the contact holder 305. The mating portions 330 are configured to be electrically terminated to corresponding mating signal contacts (not shown). In an exemplary embodiment, the other ends of the signal contacts 304 form terminating ends 332 extending downward from the bottom 316 as compliant pins. The compliant pins are configured to be press-fit in vias of the PCB 210. Other types of terminating ends 332 may be provided in alternative embodiments. The terminating ends 332 electrically connect the PCB wafer 300 to the PCB 210 (shown in FIG. 2). In an exemplary embodiment, the signal contacts 304 in each PCB wafer 300 are arranged as contact pairs configured to transmit differential signals through the PCB wafer 300. In an exemplary embodiment, the signal contacts 304 are initially held together as leadframes (not shown), which are overmolded with dielectric material to form the PCB wafer 300. Manufacturing processes other than overmolding a leadframe may be utilized.

The ground shields 308 are positioned along the exterior sides of the contact holder 305. The ground shields 308 provide electrical shielding for the signal contacts 304. Ground contacts 340 extend from the ground shields 308 to electrically connect the PCB wafer 300 to the mating ground contacts. The ground shield 308 includes ground pins 342 extending from a bottom of the main body for termination to the PCB 210. For example, the ground pins 342 may be press fit or soldered to the PCB 210.

During assembly, the PCB wafers 300 are loaded into the front housing 260, such as into the rear of the front housing 260, with the cable wafers 400. A clip 390 is used to hold the PCB wafers 300 and the cable wafers 400 in the wafer stack 264. The clip 390 may be coupled to the tops 314 and the rear's 318 of the PCB wafers 300. In an exemplary embodiment, the hybrid electrical connector assembly 246 includes a pin organizer 392 at the bottom of the hybrid electrical connector assembly 246. The terminating ends 332 and the ground pins 342 are received in the pin organizer 392 area the pin organizer 392 holds the ground pins 342 and the terminating ends 332 for mounting to the PCB 210.

Figure 13:
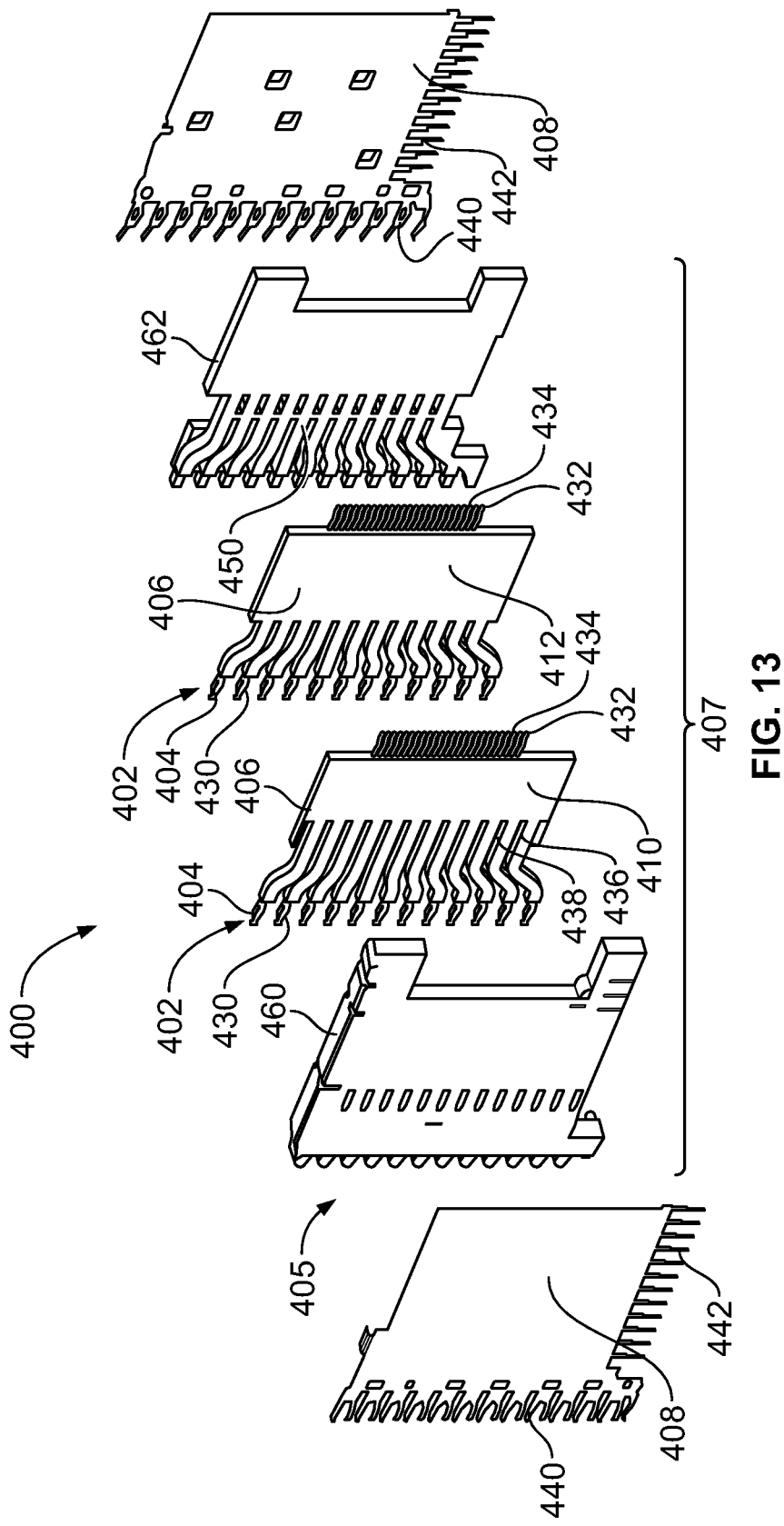
FIG. 13 is an exploded view of the cable terminated contact wafer in accordance with an exemplary embodiment.
Figure 14:
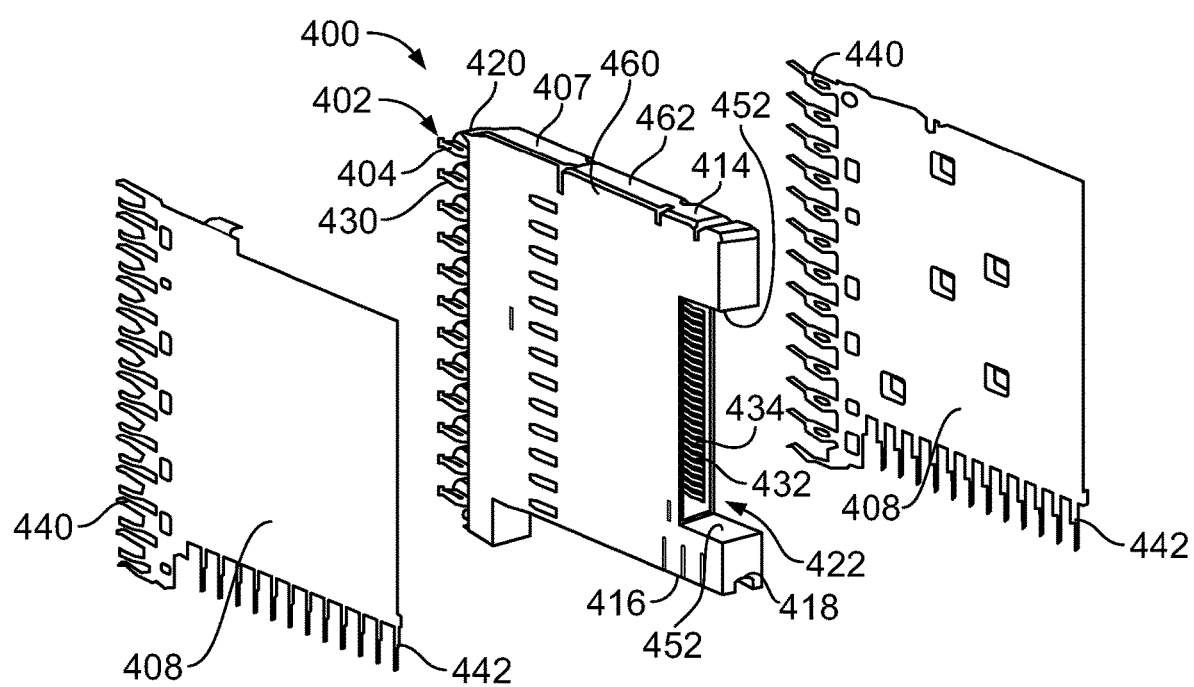
FIG. 14 is a partially assembled view of the cable terminated contact wafer in accordance with an exemplary embodiment.

FIG. 11 is a front perspective view of the cable wafer 400 in accordance with an exemplary embodiment. FIG. 12 is a rear perspective view of the cable wafer 400 in accordance with an exemplary embodiment. FIG. 13 is an exploded view of the cable wafer 400 in accordance with an exemplary embodiment. FIG. 14 is a partially assembled view of the cable wafer 400 in accordance with an exemplary embodiment.

The cable wafer 400 includes a contact array 402 having signal contacts 404. A contact holder 405 holds the signal contacts 404. In an exemplary embodiment, the contact holder 405 includes a dielectric body 406 supporting the signal contacts 404 and a ground shell 407 that holds the dielectric body 406. The ground shell 407 is conductive and provides electrical shielding for the signal contacts 404. The ground shell 407 may be a plated plastic shell in various embodiments. In other embodiments, the ground shell 407 may be molded or die cast. In the illustrated embodiment, the ground shell 407 is a multi-piece shell having a left ground shell and a right ground shell that are coupled together to hold the dielectric body 406. The cable wafer 400 includes one or more ground shields 408 extending along the contact holder 405 to provide electrical shielding for the signal contacts 404. The ground shields 408 are coupled to the ground shell 407. For example, the ground shields 408 are stamped and formed pieces, separately manufactured from the ground shell 407, and coupled thereto. In other various embodiments, the ground shields 408 and the ground shell 407 may be integral and unitary.

In an exemplary embodiment, the dielectric body 406 includes a first holder member 410 and a second holder member 412 each holding a set of the signal contacts 404. The first and second holder members 410, 412 are arranged back-to-back to form the dielectric body 406. The first holder member 410 may be received in one of the ground shell pieces and the second holder member 412 may be received in the other of the ground shell pieces. When assembled, the ground shell 407 forms the outer perimeter of the cable wafer 400. The contact holder 405 includes a top 414 and a bottom 416 defined by the ground shell 407. The contact holder 405 includes a rear 418 and a front 420 defined by the ground shell 407. In the illustrated embodiment, the contact holder 405 is generally rectangular shaped; however, the contact holder 405 may have other shapes in alternative embodiments. The contact holder 405 may include other components defining part of, or the entire outer perimeter to define the top 414, the bottom 416, the rear 418 and/or the front 420.

In an exemplary embodiment, the contact holder 405 includes a slot 422 at the rear 418. The slot 422 is configured to receive the plug connector 255 (shown in FIG. 5) of the cable assembly 250 (shown in FIG. 5). The slot 422 is bounded at the top and the bottom by the ground shell 407. The slot 422 is bounded at the right and left sides by the ground shields 408. The ground shields 408 provide electrical shielding for the slot 422. The front of the slot 422 may be defined by the ground shell 407 and/or the dielectric body 406. In an exemplary embodiment, the signal contacts 404 extend into the slot 422 for electrical connection with the plug connector 255. The signal contacts 404 and the structure of the cable wafer 400 forming the slot 422 define a socket 424 that receives and electrically connects to the plug connector 255. As such, the cable wafer 400 is configured to be electrically connected to the cable assembly 250. Signal paths are defined from the cable wafer 400 to the cable assembly 250 through the signal contacts 404. In other various embodiments, rather than having the slot 422 and the socket 424, the contact holder 405 of the cable wafer 400 may include a different type of interface, such as a plug interface configured for mating with the cable assembly 250.

Figure 15:
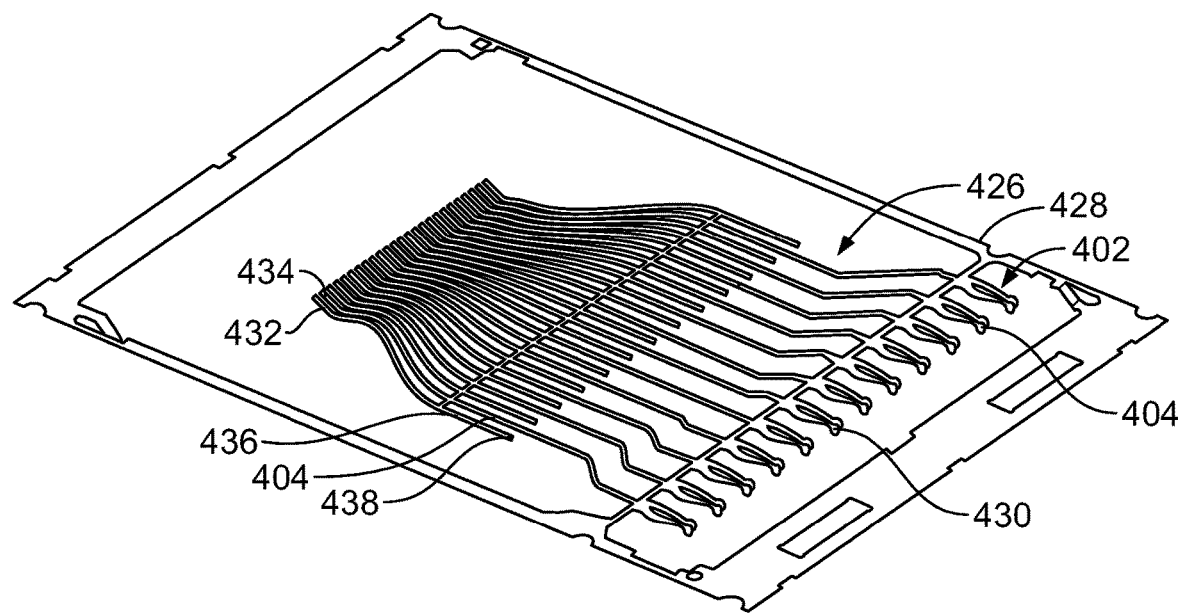
FIG. 15 illustrates a portion of the cable terminated contact wafer in accordance with an exemplary embodiment.
Figure 16:
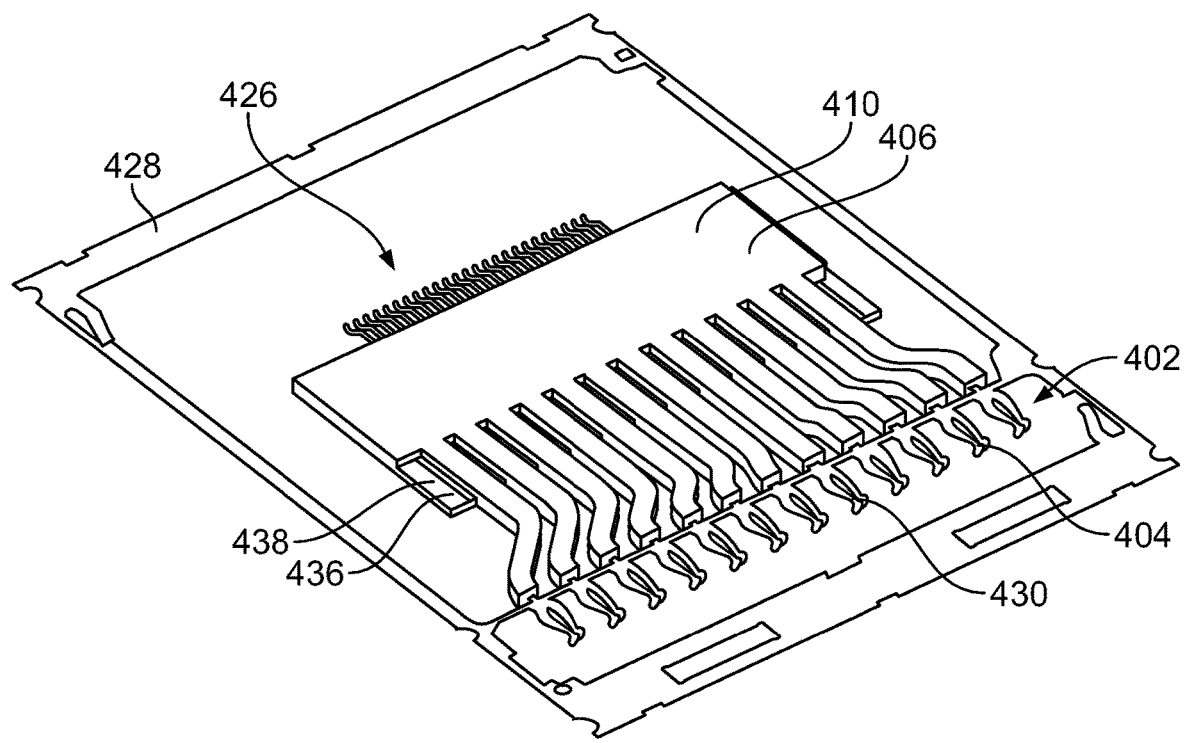
FIG. 16 illustrates a portion of the cable terminated contact wafer in accordance with an exemplary embodiment.

With additional reference to FIGS. 15 and 16, FIG. 15 illustrates a leadframe 426 having a carrier 428 holding the signal contacts 404 and FIG. 16 illustrates the dielectric body 406 overmolded over the leadframe 426. FIGS. 15 and 16 illustrate half of the contact array 402 and the other half of the contact array 402 may be manufactured in a similar manner. In an exemplary embodiment, the signal contacts 404 in each cable wafer 400 are arranged as contact pairs configured to transmit differential signals through the cable wafer 400. In an exemplary embodiment, the signal contacts 404 are initially held together as part of the leadframe 426. The leadframe 426 is overmolded with dielectric material to form the dielectric body 406. Manufacturing processes other than overmolding a leadframe may be utilized.

The signal contacts 404 have mating portions 430 extending forward from the front 420 of the dielectric body 406. The mating portions 430 are configured to be electrically terminated to corresponding mating signal contacts (not shown). In an exemplary embodiment, the other ends of the signal contacts 404 form terminating ends 432 extending toward the rear 418. In an exemplary embodiment, the terminating ends 432 are deflectable spring beams 434 extending rearward of the dielectric body 406. The deflectable spring beams 434 extend into the slot 422 to define the socket 424. The deflectable spring beams 434 configured to be electrically connected to the plug contacts 258 (shown in FIG. 5) of the plug connector 255. The deflectable spring beams 434 have separable mating interfaces configured to be spring biased against the plug connector 255 when received in the socket 424. As such, the signal contacts 404 are configured to be electrically connected to the cable assembly 250 rather than being directly connected to the PCB 210 as do the signal contacts 304 of the PCB wafer 300. Other types of terminating ends 432 may be provided in alternative embodiments.

In an exemplary embodiment, the leadframe 426 includes ground contacts 436 interspersed with the signal contacts 404. The ground contacts 436 may be overmolded by the dielectric body 406. The ground contacts 436 extend from the terminating ends 432 to terminating portions 438 in the illustrated embodiment, the terminating portions 438 are proximately centrally located between the rear 418 and the front 420. The terminating portions 438 are configured to be electrically connected to the ground shell 407 and/or the ground shield 408. The terminating portions 438 are exposed through the dielectric body 406 for electrical connection with the ground shell 407 and/or the ground shield 408. In the illustrated embodiment, the ground contacts 436 and the signal contacts 404 are arranged in an alternating pattern; however, the ground contacts 436 and the signal contacts 404 may be arranged in any pattern.

Returning to FIGS. 11-14, during assembly, the first and second holder members 410, 412 are received in the ground shell 407. In an exemplary embodiment, the ground shell 407 includes terminating portions 450 (shown in FIG. 13) extending inward to engage the terminating portions 438 of the ground contacts 436 of the contact array 402. The terminating portions 450 may be tabs configured to engage the terminating portions 438 by an interference connection. In other various embodiments, the terminating portions 450 may be deflectable spring beams configured to engage the terminating portions 438. The ground shell 407 holds the dielectric body 406 and the contact array 402. The terminating ends 432 extend rearward of the dielectric body 406 into the slot 422 defined by the ground shell 407. The ground shields 408 are coupled to both sides of the ground shell 407 to form the cable wafer 400.

The ground shields 408 are positioned along the exterior sides of the ground shell 407. The ground shields 408 provide electrical shielding for the signal contacts 404. Ground contacts 440 extend from the ground shields 408 to electrically connect the cable wafer 400 to the mating ground contacts. The ground contacts 440 extend along the mating portions 430 of the signal contacts 404. The ground shield 408 includes ground pins 442 extending from a bottom of the main body for termination to the PCB 210. For example, the ground pins 442 may be press fit or soldered to the PCB 210. The ground pins 442 are used to electrically connect the ground shields 408 to the PCB 210. The ground pins 442 may be used to mechanically support the cable wafer 400 on the PCB 210. The ground pins 442 are mounted to the PCB 210 even though the signal contacts 404 are not electrically connected to the PCB 210, but rather are electrically connected to the cable assembly 250. The bottom 416 of the contact holder 405 may rest on the PCB 210 to provide mechanical support for the cable wafer 400.

In an exemplary embodiment, the socket 424 includes guide features 452 to guide mating of the plug connector 255 into the socket 424. The guide features 452 may be formed by the walls of the ground shell 407 and/or the ground shield 408 forming the slot 422. The guide features 452 position the plug connector 255 for mating with the terminating ends 432 of the contacts. In an exemplary embodiment, the contact array 402 includes a right side contact array and a left side contact array arranged together within the ground shell 407. The signal contacts 404 are provided in both the right side contact array and the left side contact array. The terminating ends 432 of the signal contacts 404 in the right side contact array are arranged on a right side of the slot 422 and the terminating ends 432 of the signal contacts 404 in the left side contact array are arranged on a left side of the slot 422 to engage both sides of the plug connector 255. In an exemplary embodiment, the ground shell 407 includes a first holder 460 and a second holder 462 separate and discrete from the first holder 460 arranged back-to-back to hold the first and second holder members 410, 412, respectively. The first and second holders 460, 462 thus hold the signal contacts 404 in a first row and a second row for engaging both sides of the plug connector 255 at the rear end 418.

Returning to FIGS. 8-10, the PCB wafers 300 and the cable wafers 400 are arranged in the wafer stack 264 and coupled to the front housing 260 to form the hybrid electrical connector assembly 246. The hybrid electrical connector assembly 246 allows direct electrical connection to the PCB 210 and remote electrical connection to the PCB 210 through the cable assemblies 250. The PCB wafers 300 are configured to be directly electrically connected to the PCB 210. The cable wafers 400 are configured to be electrically connected to the cable assemblies 250. In an exemplary embodiment, the PCB wafers 300 and the cable wafers 400 are sized similar for engagement by the clip 390 and the pin organizer 392. For example, the tops 314, 414 may be aligned and/or the bottoms 316, 416 may be aligned and/or the fronts 320, 420 may be aligned and/or the rears 318, 418 may be aligned. In an exemplary embodiment, the clip 390 has openings 394 aligned with the slots 422 to allow access to the socket 424 by the plug connector 255. Alternately, the clip 390 could be made such that it is shorter and would not need have openings for the socket 424.

The signal contacts 304 of the PCB wafers 300 are configured to be electrically connected to the communication component 230 or 232 (shown in FIG. 2) through the circuit 290 on the PCB 210. The signal contacts 404 of the cable wafers 400 are configured to be electrically connected to the communication component 230 or 232 through the cables 251 extending from the plug connector 255 received in the socket 424. In the illustrated embodiment, the terminating ends 332 of the signal contacts 304 are provided at the bottom of the hybrid electrical connector assembly 246 and the socket 424 of the cable wafer 400 is open at a rear of the hybrid electrical connector assembly 246 to receive the plug connector 255. The mating portions 330 of the signal contacts 304 of the PCB wafers 300 define a first mating interface and the mating portions 430 of the signal contacts 404 of the cable wafers 400 define a second mating interface identical to the first mating interface. As such, the PCB wafers 300 and the cable wafers 400 may be interchangeable within the front housing 260 for mating with the mating electrical connector assembly.

Returning to FIGS. 2-4, the circuit card assembly 200 allows interconnection of the plurality of electrical connector assemblies 240 with each other and/or with one or more communication components 230, 232. The circuit card assembly 200 accepts different types of electrical connector assemblies 240, such as the board electrical connector assemblies 242, the cable electrical connector assemblies 244 and the hybrid electrical connector assemblies 246, for efficient electrical connection of the various components in a cost effective and reliable manner. The circuit card assembly 200 utilizes electrical connector assemblies 240 (board electrical connector assemblies 242 and/or hybrid electrical connector assemblies 246) that directly connect to the PCB 210 to form signal paths through the circuits 290 of the PCB 210, such as when the signal path lengths are relatively short enough to maintain signal integrity along the signal paths. The circuit card assembly 200 utilizes electrical connector assemblies 240 (cable electrical connector assemblies 244 and/or hybrid electrical connector assemblies 246) that are connected to the remote connectors 280 through the cable assemblies 250. The remote connectors 280 may be positioned much closer to the communication components 230, 232 such that the circuits 290 to a relatively short. The cables 251 of the cable assemblies 250 are able to maintain signal integrity over longer signal path lengths, thus making the cable electrical connector assemblies 244 or the hybrid electrical connector assemblies 246 useful for the long signal path length connections. In an exemplary embodiment, the board electrical connector assemblies 242, the cable electrical connector assemblies 244 and the hybrid electrical connector assemblies 246 have the same or similar mating interfaces such that any of the electrical connector assemblies 240 may be mated with any mating electrical connector assembly within the communication system 100, such as the electrical connector assemblies 142 (shown in FIG. 1).

The board electrical connector assemblies 242 provide a lower-cost and less bulky electrical connection option, whereas the cable electrical connector assemblies 244 provide an enhanced performance electrical connection option, such as for longer signal path lengths. The hybrid electrical connector assembly 246 provides the advantages of both the board electrical connector assembly 242 and the cable electrical connector assembly 244 in a single electrical connector assembly 240. The hybrid electrical connector assembly 246 allows direct connection to the PCB 210 and remote connection through the cable assemblies 250.

Figure 17:
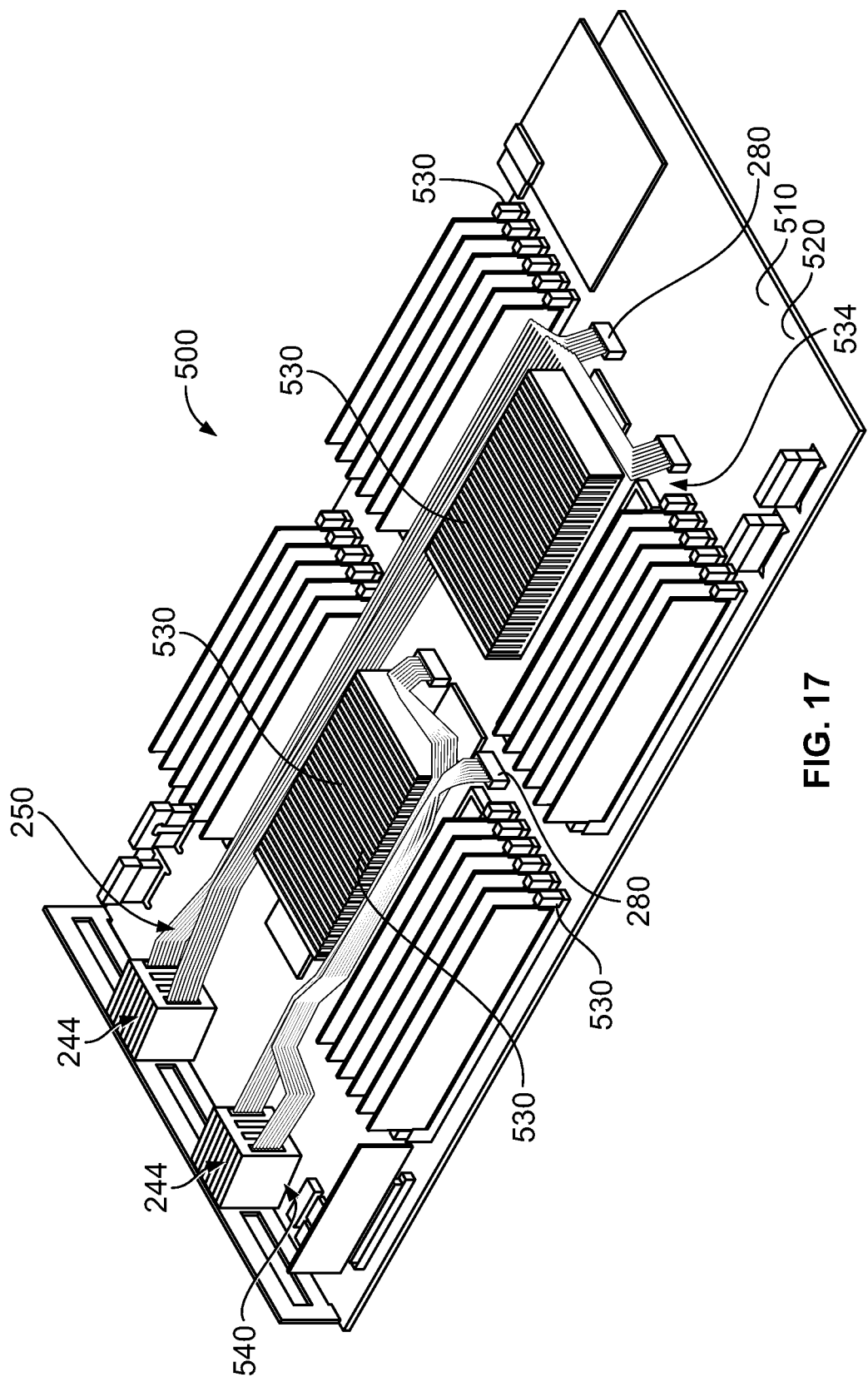
FIG. 17 illustrates a circuit card assembly in accordance with an exemplary embodiment.

FIG. 17 illustrates a circuit card assembly 500 in accordance with an exemplary embodiment. The circuit card assembly 500 includes a printed circuit board (PCB) 510. The PCB 510 hosts components on a first surface 520. The PCB 510 has various circuits interconnecting corresponding components of the circuit card assembly 500. The circuits may be defined by pads, vias, traces, or other conductors of the PCB 510.

The circuit card assembly 500 includes one or more communication components 530 on the PCB 510. The communication components 530 are coupled to the PCB 510 at corresponding mounting areas 534. The communication components 530 may be electrical components, optical components, or other types of components.

The circuit card assembly 500 includes a plurality of electrical connector assemblies 540. The electrical connector assemblies 540 have mating ends that face forward for mating with a mating circuit card assembly. In an exemplary embodiment, the electrical connector assemblies 540 are high-speed differential pair electrical connectors. The electrical connector assemblies 540 may be electrically connected to each other and/or to the communication components 530.

In the illustrated embodiment, the electrical connector assemblies 540 are cable electrical connector assemblies 244 electrically connected to remote connectors 280 through cable assemblies 250. However, in other various embodiments, the electrical connector assemblies 540 may be hybrid electrical connector assemblies 246 and/or board electrical connector assemblies 242. In other various embodiments, the circuit card assembly 500 may include more than one type of electrical connector assemblies, such as board electrical connector assemblies 242 and/or cable electrical connector assemblies 244 and/or hybrid electrical connector assemblies 246. The type of electrical connector assembly may depend on the signal path lengths between the electrical connector assemblies 540 and the source or destination for the signals. For short signal path lengths, such signals may be routed through a direct connection to the PCB 510 from the electrical connector assembly 540. For long signal path lengths, such signals may be routed through the cable assembly 250.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector assembly for a communication system comprising:
    a housing having a mating end configured for mating with a mating electrical connector, the housing having a chamber; and
    a wafer assembly received in the chamber, the wafer assembly including a PCB terminated contact wafer and a cable terminated contact wafer arranged parallel to each other in a wafer stack;
    the PCB terminated contact wafer including a first contact array having first signal contacts, a first contact holder holding the first signal contacts, and a first ground shield extending along the first contact holder to provide electrical shielding for the first signal contacts, the first signal contacts having mating portions arranged in the housing for mating with the mating electrical connector, the first signal contacts having terminating ends extending from the first contact holder to an exterior of the contact holder for termination to a printed circuit board of the communication system;
    the cable terminated contact wafer including a second contact array having second signal contacts, a second contact holder holding the second signal contacts, and a second ground shield extending along the second contact holder to provide electrical shielding for the second signal contacts, the second contact holder including a mating interface configured for mating with a cable connector of a cable assembly, the second signal contacts having mating portions arranged in the housing for mating with the mating electrical connector, the second signal contacts having terminating ends arranged at the mating interface to electrically connect to the cable connector.

2. The electrical connector assembly of claim 1, wherein the first signal contacts are configured to be electrically connected to a communication component through a circuit on the printed circuit board and wherein the second signal contacts are configured to be electrically connected to the communication component through cables extending from a plug connector.

3. The electrical connector assembly of claim 1, wherein the mating portions of the first signal contacts define a first mating interface and the mating portions of the second signal contacts define a second mating interface identical to the first mating interface.

4. The electrical connector assembly of claim 1, wherein the PCB terminated contact wafer is a first PCB terminated contact wafer, the wafer assembly further comprising a second PCB terminated contact wafer, the cable terminated contact wafer being arranged in the wafer stack between the first PCB terminated contact wafer and the second PCB terminated contact wafer.

5. The electrical connector assembly of claim 1, wherein the cable terminated contact wafer is a first cable terminated contact wafer, the wafer assembly further comprising a second cable terminated contact wafer, the PCB terminated contact wafer being arranged in the wafer stack between the first cable terminated contact wafer and the second cable terminated contact wafer.

6. The electrical connector assembly of claim 1, further comprising a cable assembly including a bundle of cables extending between a first cable connector and a second cable connector, the first cable connector having a plug connector received in a socket of the cable terminated contact wafer, the cables being routed away from the cable terminated contact wafer to a remote location, the second cable connector being electrically connected to a remote connector at the remote location.

7. The electrical connector assembly of claim 1, wherein the second contact array includes a right side contact array and a left side contact array, the second signal contacts being arranged in the right side contact array and the left side contact array, the terminating ends of the second signal contacts in the right side contact array being arranged on a right side of the mating interface and the terminating ends of the second signal contacts in the left side contact array being arranged on a left side of the mating interface to engage both sides of a plug connector.

8. The electrical connector assembly of claim 1, wherein the second contact holder includes a first holder and a second holder separate and discrete from the first holder being arranged back-to-back to hold corresponding second signal contacts in a first row and a second row, respectively, for engaging both sides of a plug connector.

9. The electrical connector assembly of claim 1, wherein the PCB terminated contact wafer has an outer perimeter defined by a top, a bottom, a front and a rear, the cable terminated contact wafer having an outer perimeter defined by a top, a bottom, a front and a rear, the tops being aligned, the bottoms being aligned, and the fronts being aligned.

10. The electrical connector assembly of claim 1, wherein the terminating ends of the first signal contacts include compliant pins configured to be press-fit in vias of the printed circuit board, and wherein the terminating ends of the second signal contacts include spring beams having separable mating interfaces configured to be spring biased against the cable connector.

11. The electrical connector assembly of claim 1, wherein the terminating ends of the first signal contacts are provided at a bottom of the electrical connector assembly and the mating interface of the cable terminated contact wafer is at a rear of the electrical connector assembly to receive the cable connector.

12. A communication system comprising:
a printed circuit board having a first mounting area, a second mounting area remote from the first mounting area and a third mounting area having a communication component electrically connected to the printed circuit board at the third mounting area, the printed circuit board having a first circuit between the first mounting area and the third mounting area being electrically connected to the communication component, and the printed circuit board having a second circuit between the second mounting area and the third mounting area being electrically connected to the communication component;
a remote connector electrically connected to the printed circuit board at the second mounting area;
a cable assembly having a bundle of cables extending between a first cable connector and a second cable connector, the second cable connector being mated with and electrically connected to the remote connector; and
an electrical connector assembly electrically connected to the printed circuit board at the first mounting area, the electrical connector assembly comprising a housing having a mating end configured for mating with a mating electrical connector and a wafer assembly received in a chamber of the housing, wherein the wafer assembly includes a PCB terminated contact wafer and a cable terminated contact wafer arranged parallel to each other in a wafer stack,
the PCB terminated contact wafer including a first contact array having first signal contacts, a first contact holder holding the first signal contacts, and a first ground shield extending along the first contact holder to provide electrical shielding for first signal contacts, the first signal contacts having mating portions arranged in the housing for mating with the mating electrical connector, the first signal contacts having terminating ends extending from the first contact holder for termination to the printed circuit board at the first mounting area, the terminating ends of the first signal contacts being electrically connected to the first circuit of the printed circuit board at the first mounting area;
the cable terminated contact wafer including a second contact array having second signal contacts, a second contact holder holding the second signal contacts, and a second ground shield extending along the second contact holder to provide electrical shielding for second signal contacts, the second contact holder including a mating interface configured to mate with the first cable connector of the cable assembly, the second signal contacts having mating portions arranged in the housing for mating with the mating electrical connector, the second signal contacts having terminating ends arranged at the mating interface for electrical connection with the first cable connector, wherein the second signal contacts are electrically connected to the second circuit of the printed circuit board through the cables and the remote connector.

13. The electrical connector assembly of claim 12, wherein the first cable connector includes a plug connector having a circuit card having a card edge, the card edge being loaded into a socket of the cable terminated contact wafer at the mating interface to electrically connect to the terminating ends of the second signal contacts of the cable terminated contact wafer.

14. The electrical connector assembly of claim 12, wherein the mating portions of the first signal contacts define a first mating interface and the mating portions of the second signal contacts define a second mating interface identical to the first mating interface.

15. The electrical connector assembly of claim 12, wherein the PCB terminated contact wafer is a first PCB terminated contact wafer, the wafer assembly further comprising a second PCB terminated contact wafer, and wherein the cable terminated contact wafer is a first cable terminated contact wafer, the wafer assembly further comprising a second cable terminated contact wafer, the first and second PCB terminated contact wafers and the first and second cable terminated contact wafers being arranged in the wafer stack.

16. The electrical connector assembly of claim 12, wherein the second contact array includes a right side contact array and a left side contact array, the second signal contacts being arranged in the right side contact array and the left side contact array, the terminating ends of the second signal contacts in the right side contact array being arranged on a right side of the mating interface and the terminating ends of the second signal contacts in the left side contact array being arranged on a left side of the mating interface to engage both sides of the first cable connector.

17. A communication system comprising:
a printed circuit board having a first mounting area, a second mounting area remote from the first mounting area and a third mounting area having a communication component electrically connected to the printed circuit board at the third mounting area, the printed circuit board having a first circuit between the first mounting area and the third mounting area being electrically connected to the communication component;

a first electrical connector assembly electrically connected to the printed circuit board at the first mounting area, the first electrical connector assembly comprising a first housing having a mating end configured for mating with a first mating electrical connector and a first wafer assembly received in a chamber of the first housing, wherein the first wafer assembly includes a plurality of PCB terminated contact wafers arranged parallel to each other in a first wafer stack, each PCB terminated contact wafer including a first contact array of first signal contacts held by a first contact holder having mating portions arranged in the first housing defining a first mating interface for mating with the first mating electrical connector and first terminating ends extending from the first contact holder for termination to the first circuit of the printed circuit board at the first mounting area; and a second electrical connector assembly electrically connected to the printed circuit board at the second mounting area, the second electrical connector assembly comprising a second housing having a mating end configured for mating with a second mating electrical connector and a second wafer assembly received in a chamber of the second housing, wherein the second wafer assembly includes a plurality of cable terminated contact wafers arranged parallel to each other in a second wafer stack, each cable terminated contact wafer including a second contact array of second signal contacts held by a second contact holder having second mating portions arranged in the second housing defining a second mating interface for mating with the second mating electrical connector and second terminating ends, the second contact holder including a mating interface configured to mate with a connector of a cable assembly, the second terminating ends arranged at the mating interface for electrical connection to the cable connector;

wherein the first mating interface and the second mating interface are each configured to mate with either of the first and second mating electrical connectors; and wherein the first electrical connector assembly is electrically connected to the communication component through the first circuit of the printed circuit board, and wherein the second electrical connector assembly is electrically connected to the communication component through cables of the cable assembly.

18. The electrical connector assembly of claim 17, wherein the second electrical connector assembly includes a plurality of PCB terminated contact wafers arranged parallel to the cable terminated contact wafers in the second wafer stack.

19. The electrical connector assembly of claim 17, further comprising:

a remote connector electrically connected to a second circuit of the printed circuit board remote from the second mounting area, the second circuit being electrically connected to the communication component; and a cable assembly having a bundle of cables extending between a first cable connector and a second cable connector, the second cable connector being mated with and electrically connected to the remote connector;

wherein the second signal contacts are electrically connected to the communication component through the first cable connector, the cables, the second cable connector, the remote connector and the second circuit.

20. The electrical connector assembly of claim 17, wherein the first electrical connector is positioned a first distance to the communication component and the second electrical connector is positioned a second distance from the communication component greater than the first distance.

* * * * *